United States Patent
Lin et al.

(10) Patent No.: US 6,537,909 B1
(45) Date of Patent: Mar. 25, 2003

(54) METHOD OF PREVENTING SILICIDE SPIKING

(75) Inventors: Wan-Jeng Lin, Taipei Hsien (TW); Jen-Hung Larn, Taipei Hsien (TW); Yung-Chung Lin, Tai-Chung Hsien (TW); Tzung Han Lee, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/683,468

(22) Filed: Jan. 3, 2002

(51) Int. Cl.[7] .............................................. H01L 21/44
(52) U.S. Cl. ........................ 438/653; 438/655; 438/656; 438/657; 438/663
(58) Field of Search ................................ 438/653, 655, 438/656, 657, 663

(56) References Cited

U.S. PATENT DOCUMENTS

| | | | |
|---|---|---|---|
| 5,604,140 A | * 2/1997 | Byun | 438/653 |
| 5,608,249 A | * 3/1997 | Gonzalez | 257/306 |
| 5,668,394 A | * 9/1997 | Lur et al. | 257/413 |
| 5,695,564 A | * 12/1997 | Imahashi | 118/719 |
| 6,217,721 B1 | * 4/2001 | Xu et al. | 204/192.17 |
| 6,281,052 B1 | * 8/2001 | Shinmura | 438/142 |
| 6,334,411 B1 | * 2/2002 | Yamada et al. | 438/653 |

* cited by examiner

Primary Examiner—T. N. Quach
(74) Attorney, Agent, or Firm—Winston Hsu

(57) ABSTRACT

A polysilicon layer is formed on a semiconductor substrate followed by performing a collimator physical vapor deposition (PVD) process to form a titanium nitride layer on the polysilicon layer. A rapid thermal nitridation (RTN) process is then performed to tighten the structure of the titanium nitride layer. Finally, a silicide layer is formed on the barrier layer. By using the titanium nitride layer, the interface between the silicide layer and the polysilicon layer is effective prevented from occurring a spike.

11 Claims, 4 Drawing Sheets

METHOD OF PREVENTING SILICIDE SPIKING

BACKGROUND OF THE INVENTION

1. Field of the Invention

The present invention relates to a method of preventing silicide spiking, and more particularly, to a method of preventing the occurrence of silicide spiking to a gate of an embedded dynamic random access memory (EDRAM) cell.

2. Description of the prior Art

Dynamic random access memory (DRAM) is composed of a memory array region and a logic circuit region. With increasing integration of electrical circuit elements, the trend of manufacturing semiconductor integrated circuits is to integrate memory array region and high-speed logic circuit elements into a single chip to form an embedded memory. The embedded memory not only significantly reduces the circuit area but also greatly increases the signal processing speed.

In order to improve the electrical performance of the embedded memory, a silicide layer is often required in a gate structure to reduce contact resistance of the gate. However, during the formation of the gate, silicide spiking occurs. The silicide spiking is resulted from the solubility of metal such as titanium (Ti) or aluminum (Al) in silicon. Specifically, metal ions in the silicide layer frequently penetrate through the interface of the silicide layer and the polysilicon layer to diffuse into the polysilicon layer, forming silicide spiking to affect the electrical performance of the gate. Currently, a method to prevent silicide spiking is to form a barrier layer on the polysilicon layer prior to the deposition of the silicide layer. Thus, by using the barrier layer, metal ions are prevented from diffusing downward to induce silicide spiking.

Please refer to FIG. 1 and FIG. 2 of schematic diagrams of fabricating a wire according to the prior art. As shown in FIG. 1, a silicon oxide layer 12, a polysilicon layer 14, a barrier layer 16 and a silicide layer 18 are formed, respectively, on a surface of a semiconductor substrate 10. Normally, the barrier layer 16 is a silicon nitride layer and the silicide layer 18 is a titanium silicide (TiSi$_2$) layer. A conventional method to form the barrier layer 16 is to use a physical vapor deposition (pVD) process, such as reactive sputtering method, with argon gas and nitrogen gas as reactive gases to bombard a metal target to release titanium atoms. The released titanium atoms thereafter react with nitrogen atoms that are ionized by the plasma, forming titanium nitride on the surface of the polysilicon layer 14. However, the structure of the barrier layer 16 formed by reactive sputtering method is seldom tight enough to prevent metal ions in the silicide layer 18 from diffusing downward in a subsequent thermal process. Thus, a spike 19 of the silicide layer 18 is produced to intrude into the barrier layer 16, and even into the polysilicon layer 14.

Subsequently, as shown in FIG. 2, a photolithographic and etching process is performed. A photoresist layer (not shown) is coated on the surface of the semiconductor substrate 10 to define gate patterns in the photoresist layer. According to the patterns in the photoresist layer, portions of the silicide layer 18, portions of the barrier layer 16, portions of the polysilicon layer 14 and portions of the silicon oxide layer 12 are removed down to the surface of the silicon substrate 10, thus forming a gate 20. Finally, fabricating processes to form other electrical elements, such as source and drain, are performed to complete the MOS transistor of the EDRAM cell. The details of these processes are not the major concern and are thus omitted for simplicity of description.

As the physical vapor deposition of the prior art cannot provide a tight barrier layer 16, the spike 19 occurs on the interface between the silicide layer 18 and the barrier layer 16 and induces leakage currents to affect the electrical performance. In addition, portions of the spike 19 penetrating through the barrier layer 16 also destroy stress properties of the whole barrier layer 16, thus reducing the reliability of the gate 20.

SUMMARY OF INVENTION

It is therefore an objective of the present invention to prevent the occurrence of a spike in a silicide layer as in the prior art.

It is another objective of the present invention to provide a method of improving a ring oscillator period of an EDRAM cell and increasing the reliability thereof.

According to the claimed invention, a polysilicon layer is formed on a semiconductor substrate followed by performing a collimator physical vapor deposition process to form a barrier layer on the polysilicon layer. A rapid thermal process (RTP) is then performed to tighten the structure of the barrier layer. Finally, a silicide layer is formed on the barrier layer.

It is an advantage of the present invention that the collimator is used as an assistant to form the barrier layer and the RTP process is performed to tighten the barrier layer's structure after the deposition of the barrier later. As a result, the silicide layer is prevented from occurring spiking, the contact resistance of the polysilicon layer is reduced, and the production reliability is improved. In addition, as the method of forming the barrier layer of the present invention is employed in an EDRAM cell, especially in a gate of a MOS transistor in the logic circuit region, an obvious decrease in a ring oscillator period of the logic circuit region is made as a result of decreasing the contact resistance of the gate. To be specific, the delay time of the logic circuit region is reduced as a result of decreasing the contact resistance of the gate, thus both the logical computation ability and the electrical performance are greatly improved.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

DETAILED DESCRIPTION please refer to FIG. 3 and FIG. 4 of schematic diagrams of fabricating a wire 40 of an EDRAM cell (not shown) on a semiconductor substrate 30, wherein the wire 40 is functioned as a word line, a bit line or a gate. As shown in FIG.3, the method of forming the wire 40 begins with performing a thermal oxidation to grow a silicon oxide layer 32 on the semiconductor substrate 30. Then, a deposition process, such as a low-pressure chemical vapor deposition (LPCVD), is performed to form a polysilicon layer 34 on the silicon oxide layer 32. To reduce the resistance of the polysilicon layer 34, a doping process is performed to introduce a dopant into the polysilicon layer 34. Two approaches of the doping process are frequently adopted. The first approach is that the dopant is introduced in-situ with the formation of the polysilicon layer 34. The second approach is that after the polysilicon layer 34 is formed, a thermal diffusion process or an ion implantation process implants the dopant into the polysilicon layer 34.

After the polysilicon layer 34 is formed, a physical vapor deposition is performed to form a barrier layer 36 of titanium nitride on the polysilicon layer 34. To improve the tightness of the barrier layer 36, a collimator is used as a deposition assistant to reduce the deposition speed of the barrier layer 36 as well as to reduce the sputtering angles. Therefore, the barrier layer 36 is uniformly formed with a tighter structure. Subsequently, a rapid thermal process is performed. Normally, a rapid thermal nitridation (RTN) process is employed at a temperature between 600 and 850° C. to tighten the structure of the barrier layer 36. In addition, in order to compensate the delayed deposition time by using the collimator, the physical vapor deposition is suggested to be a high-power sputtering process with a power ranging from 10 to 20 kilowatts (KW) to increase the ionizing rate of the plasma. Subsequently, a silicide layer 38 of titanium silicide is formed on the barrier layer 36.

Figure 1:
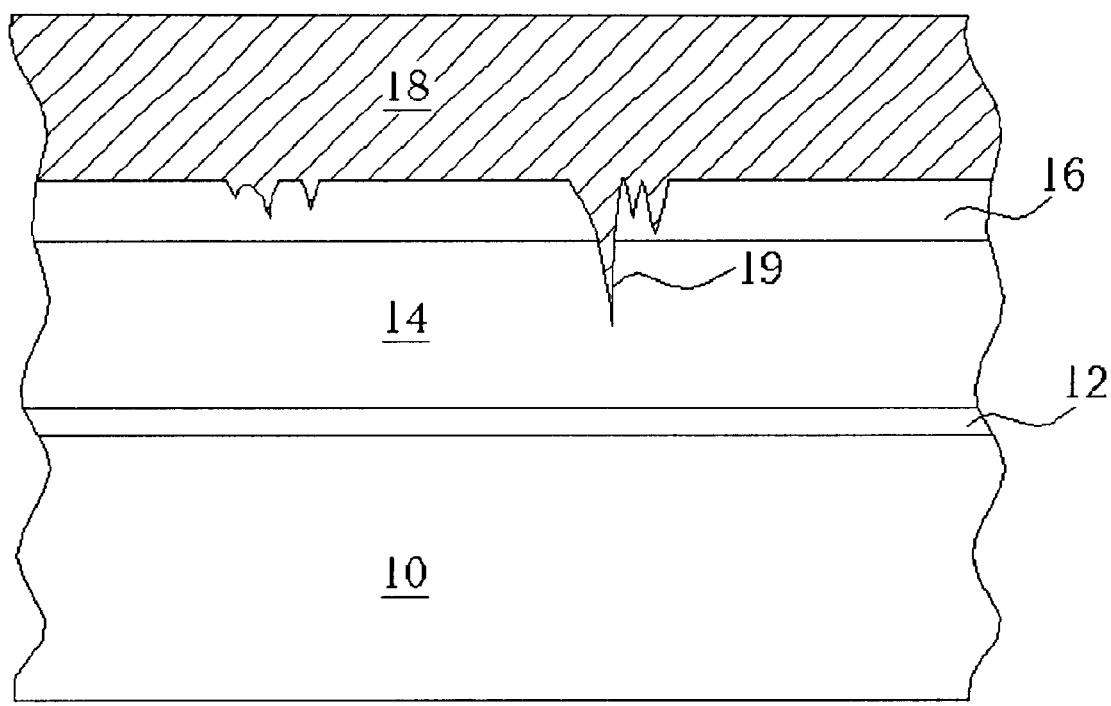
FIG. 1 and FIG. 2 are schematic diagrams of fabricating a wire according to the prior art.
Figure 2:
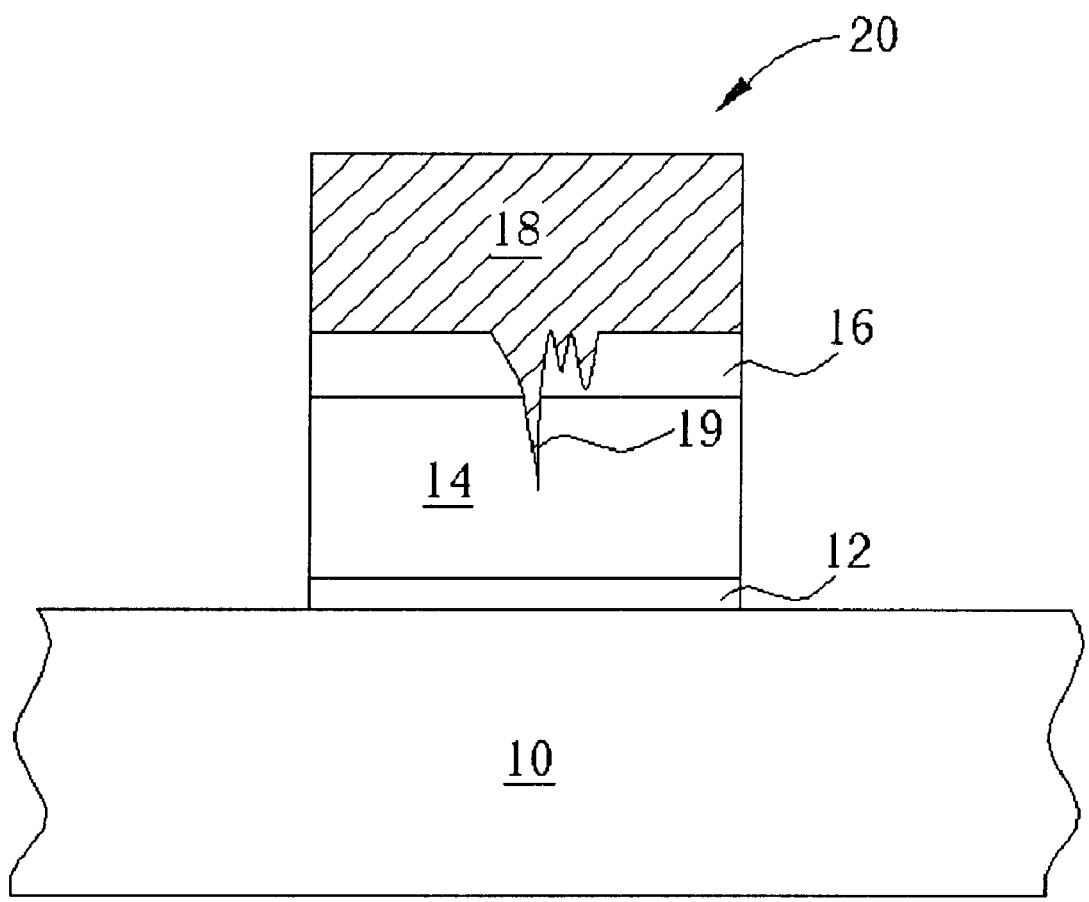
Figure 3:
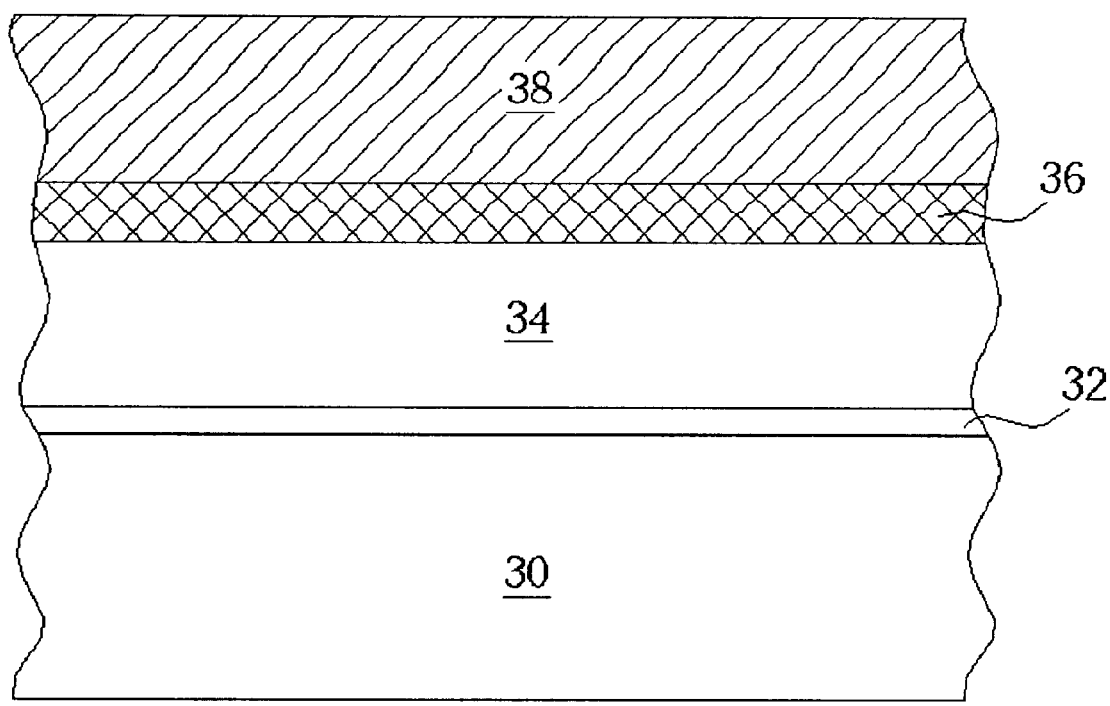
FIG. 3 and FIG. 4 are schematic diagrams of fabricating a wire according to the present invention.
Figure 4:
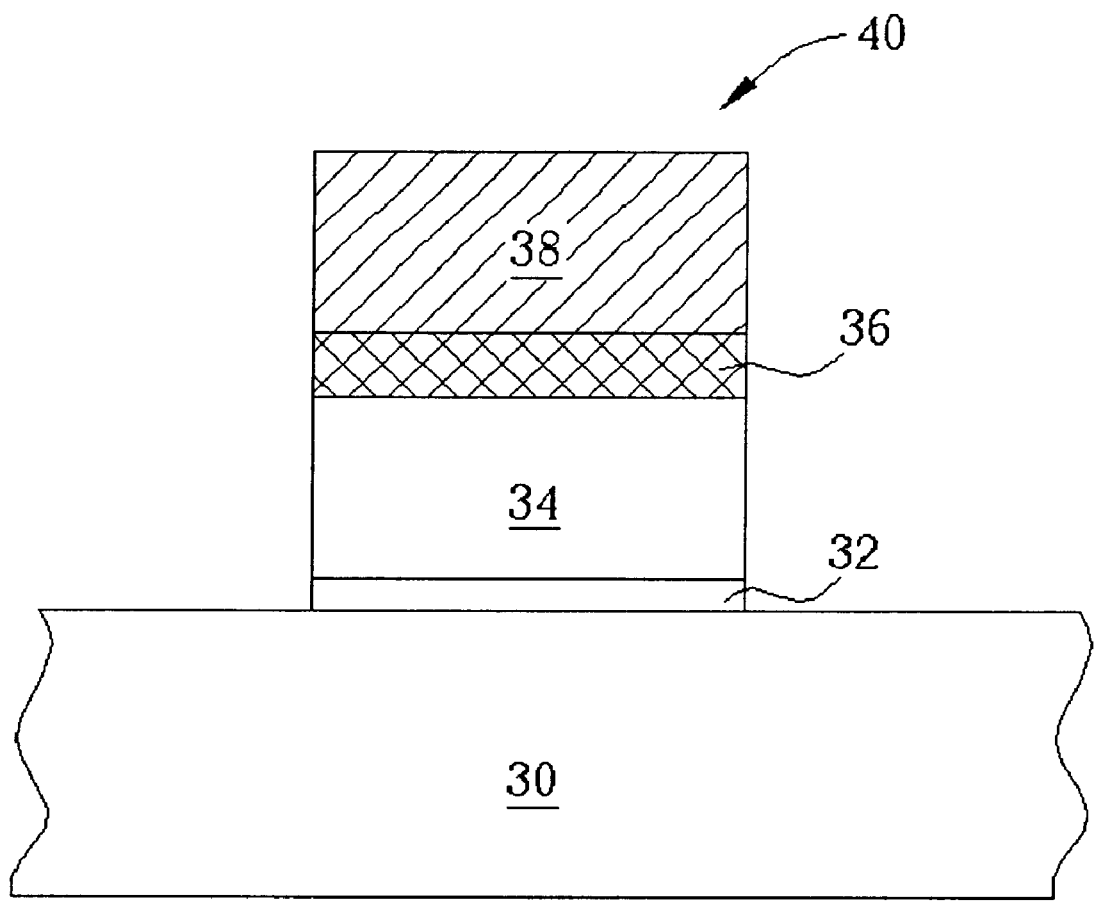

As shown in FIG.4, a photolithographic and etching process are then performed. A photoresist layer (not shown) is coated on the surface of the semiconductor substrate 30 to define gate patterns in the photoresist layer. According to the patterns in the photoresist layer, portions of the silicide layer 38, portions of the barrier layer 36, portions of the polysilicon layer 34 and portions of the silicon oxide layer 32 are thereafter removed down to the surface of the silicon substrate 30, thus forming a wire 40. Finally, fabricating processes of forming other electrical elements such as lightly doped drains (LDDs), spacers, source or drain are performed to complete the MOS transistor and other devices of the EDRAM cell. Details of these subsequent processes are not the major concern of the present invention and are omitted for simplicity of description.

The method of the present invention is characterized by using the collimator to perform the high-power sputtering process so as to form the barrier layer 36 with a tighter structure. In addition, after the sputtering process, the RTN process is employed to further tighten the structure of the barrier layer 36. As a result, the silicide layer 38 is effectively prevented from occurring spiking. Leakage currents and the contact resistance of the wire 40 are also reduced with improved stress properties of the barrier layer 36. In addition, as the method of forming the wire 40 of the present invention is employed in an EDRAM cell, especially in a gate of a MOS transistor in the logic circuit region, an obvious decrease in a ring oscillator period of the logic circuit region is made as a result of decreasing the contact resistance of the gate. To be specific, the delay time of the logic circuit region is reduced as a result of decreasing the contact resistance of the gate, thus both the logical computation ability and the electrical performance are significantly improved.

In contrast to the prior art of forming the barrier layer in the wire, the present invention uses the collimator as a deposition assistant during the sputtering process of the barrier layer. In addition, after the sputtering process, the present invention further performs the RTN process to tight the barrier layer's structure and improve the uniformity of the barrier layer. Thus, silicide spiking is effectively prevented to reduce the contact resistance of the wire and improve the production reliability according to the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of preventing silicide spiking, the method comprising:

providing a semiconductor substrate;

forming a polysilicon layer on the semiconductor substrate;

performing a collimator physical vapor deposition process to form a titanium nitride (TiN) layer on the polysilicon layer and performing a rapid thermal nitridation (RTN) process to tighten the structure of the titanium nitride layer; and forming a titanium silicide layer on the titanium nitride layer.

2. The method of claim 1 wherein the physical vapor deposition process comprises a sputtering process.

3. The method of claim 2 wherein a power of the sputtering process ranges from 10 kilowatts (KW) to 20 kilowatts.

4. The method of claim 1 wherein a temperature of the rapid thermal nitridation process range from 600 to 850° C.

5. The method of claim 1 wherein the polysilicon layer is formed in a word line, a bit line or a gate, and the silicide layer is used to reduce contact resistances of the word line, the bit line or the gate.

6. A method of improving a ring oscillator period of an embedded dynamic random access memory (EDRAM), the embedded memory comprising a polysilicon layer positioned on a semiconductor substrate, the method comprising:

using a collimator to perform a sputtering process to form a uniform barrier layer on the polysilicon layer;

performing a rapid thermal nitridation process to tighten the structure of the barrier layer; and forming a titanium silicide layer on the barrier layer;

wherein the barrier layer prevents the silicide layer from the occurrence of spiking, thus providing the embedded dynamic random access memory with low contact resistance and reducing the ring oscillator period of the embedded dynamic random access memory.

7. The method of claim 6 wherein a photolithographic process and an etching process are further performed to remove portions of the silicide layer, portions of the barrier layer and portions of the polysilicon layer to form a wire after the silicide layer is formed, and the barrier layer functions to reduce the ring oscillator period of the wire.

8. The method of claim 7 wherein the wire comprises one of either a word line, a bit line or a gate.

9. The method of claim 6 wherein the barrier layer comprises titanium nitride.

10. The method of claim 9 wherein a temperature of the rapid thermal nitridation process ranges from 600 to 850°.

11. The method of claim 6 wherein a power of the sputtering process ranges from 10 kilowatts (KW) to 20 kilowatts.

* * * * *